United States Patent
Otsuka

(10) Patent No.: US 9,354,628 B2
(45) Date of Patent: May 31, 2016

(54) COMPONENT MOUNTING DEVICE AND COMPONENT MOUNTING METHOD

(75) Inventor: Toshihide Otsuka, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 470 days.

(21) Appl. No.: 13/577,558

(22) PCT Filed: Oct. 13, 2011

(86) PCT No.: PCT/JP2011/005746
§ 371 (c)(1),
(2), (4) Date: Aug. 7, 2012

(87) PCT Pub. No.: WO2012/107974
PCT Pub. Date: Aug. 16, 2012

(65) Prior Publication Data
US 2014/0207270 A1    Jul. 24, 2014

(30) Foreign Application Priority Data

Feb. 7, 2011 (JP) .................................. 2011-023617

(51) Int. Cl.
*G06F 19/00* (2011.01)
*G06F 17/00* (2006.01)
(Continued)

(52) U.S. Cl.
CPC .............. *G05B 19/418* (2013.01); *H05K 13/08* (2013.01)

(58) Field of Classification Search
CPC ............... G05B 19/41; G05B 2219/31; G05B 2219/32; G05B 2219/49; H05K 13/04; H05K 13/00; H05K 13/08
USPC ............ 700/121, 116, 231, 235, 95; 209/552; 29/701, 706, 720, 593
See application file for complete search history.

(56) References Cited

U.S. PATENT DOCUMENTS 6,571,462 B1 * 6/2003 Mimura ............. H05K 13/0452
29/743
2001/0001167 A1 * 5/2001 Asai ................... H05K 13/0408
29/833
(Continued)

FOREIGN PATENT DOCUMENTS

JP    2003-218588 A    7/2003
JP    2005-116598 A    4/2005
(Continued)

OTHER PUBLICATIONS

Office Action for Chinese Application No. 201180010359.1 dated May 25, 2015.

*Primary Examiner* — Mohammad Ali
*Assistant Examiner* — Md Azad
(74) *Attorney, Agent, or Firm* — Pearne & Gordon LLP

(57) ABSTRACT

A mounting turn that is going to be performed from now on and the identifiers of the feeders that are the supply sources of the components for the mounting turn are read out from a mounting program, and it is determined whether there is a non-supply feeder which does not supply a component to the component supply position 13p in the feeders corresponding to the identifiers that are read out, based on the output from the component detecting sensors provided in the feeders corresponding to the identifiers that are read out. As a result, when there is not a non-supply feeder, the mounting turn that is read out is performed, and when there is a non-supply feeder, the performing of the mounting turn that is read out is suspended and another mounting turn is read out.

6 Claims, 6 Drawing Sheets

(51) Int. Cl.
*B23P 21/00* (2006.01)
*B23Q 15/00* (2006.01)
*B23P 19/00* (2006.01)
*H05K 3/30* (2006.01)
*G01R 31/28* (2006.01)
*G05B 19/418* (2006.01)
*H05K 13/08* (2006.01)

(56) References Cited

U.S. PATENT DOCUMENTS

| | | | | |
|---|---|---|---|---|
| 2004/0128827 A1* | 7/2004 | Shimizu | ............ | H05K 13/0069 29/739 |
| 2004/0130863 A1* | 7/2004 | Shimizu | ............ | H05K 13/0417 361/679.01 |
| 2005/0125998 A1* | 6/2005 | Mimura | ................ | H05K 13/08 29/832 |
| 2008/0154392 A1* | 6/2008 | Maenishi | ............... | H05K 13/08 700/32 |
| 2009/0300908 A1* | 12/2009 | Endo | ...................... | H05K 13/04 29/739 |
| 2012/0240388 A1* | 9/2012 | Ishimoto | ............ | H05K 13/0452 29/593 |

FOREIGN PATENT DOCUMENTS

| | | |
|---|---|---|
| JP | 2006-148164 A | 6/2006 |
| JP | 2008-186992 A | 8/2008 |
| JP | 2009-059928 A | 3/2009 |

\* cited by examiner

FIG. 5

| MOUNTING TURN | FEEDER NUMBER |
|---|---|
| 1 | 1 |
| | 2 |
| 2 | 3 |
| | 4 |
| 3 | 5 |
| | 6 |
| 4 | 7 |
| | 8 |
| ⋮ | ⋮ |

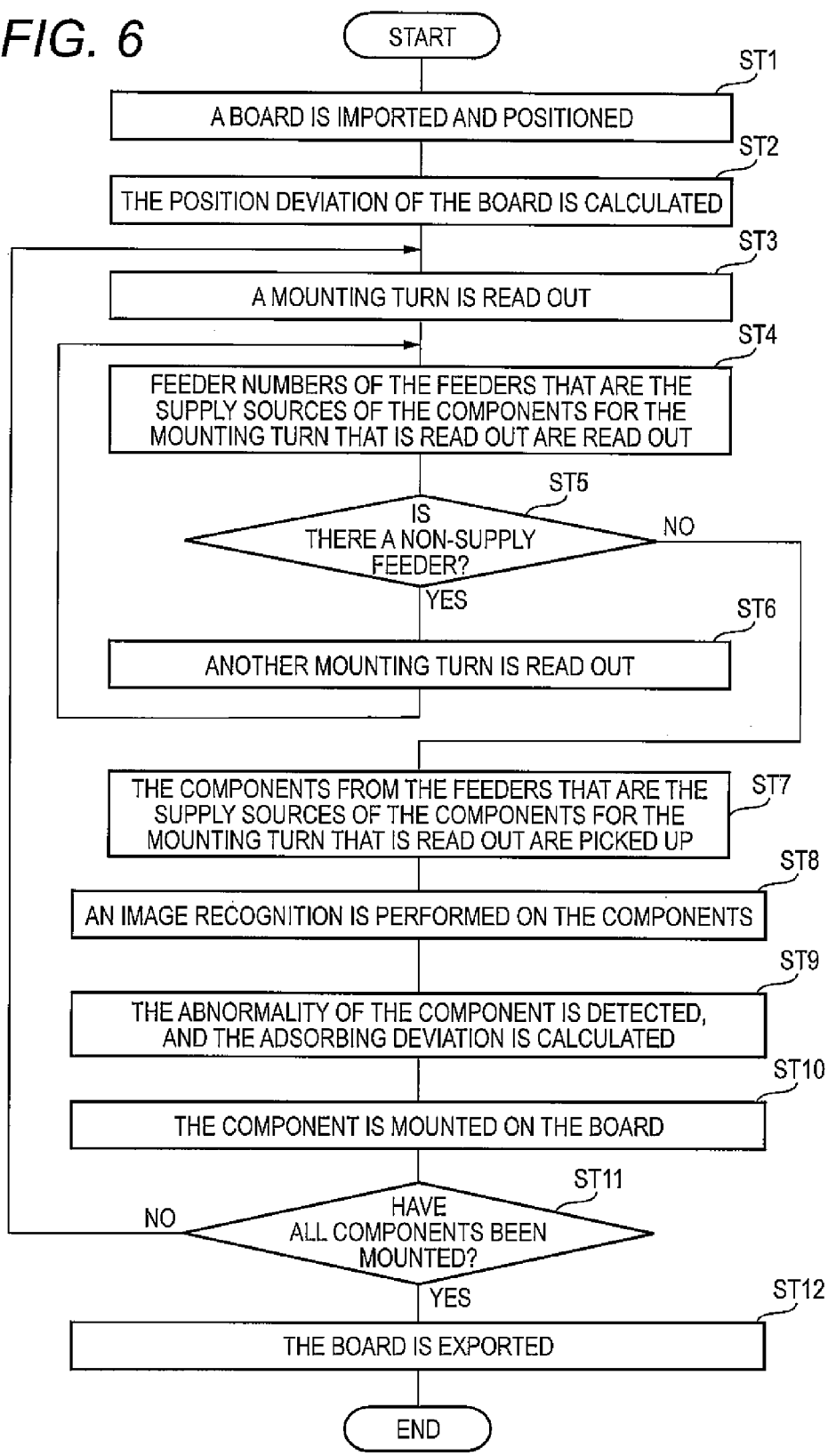

COMPONENT MOUNTING DEVICE AND COMPONENT MOUNTING METHOD

TECHNICAL FIELD

The present invention relates to a component mounting device and a component mounting method which mount a component on a board by controlling operations of an mounting head based on a mounting program.

BACKGROUND ART

A component mounting device includes a board positioning part that positions a board, a component supply part that includes a plurality of feeders which supply components (electronic components) to component supply positions, and an mounting head that picks up and mounts the components supplied by the feeders on the board which is positioned by the board positioning part. A control device mounts the components on the board by controlling operations of the mounting head based on a mounting program in which the procedure of mounting turns that are the operations of the mounting head from picking up the component to mounting the component on the board, and the identifiers of the feeders which are the supply sources of the components for the mounting turns are recorded (for example, patent document 1).

In the component mounting device, when a mounting turn which is read out from the mounting program is performed, if a component is not supplied to the component supply position of a feeder which is the supply source of the component (the component has not yet arrived at the component supply position), the mounting head has a pickup miss, and performs the pickup again (retry), expecting that a component is supplied to the component supply position.

RELATED ART DOCUMENT

Patent Document

Patent document 1: Japan Patent Publication No. 2005-116598

SUMMARY OF THE INVENTION

Problems to be Solved by the Invention

However, as described above, when the mounting head has a pickup miss and performs a retry, because the mounting head waits until a component is supplied to the component supply position of the feeder, there is a problem that tact loss is produced and the productivity of the board is decreased at this time. Particularly, when the feeders have a structure that leads components supplied in an individual state to the component supply position (such as bulk feeders, stick feeders, or bowl feeders) unlike tape feeders which make the taping, a retry as above is more likely to occur.

Thus, an object of the invention is to provide a component mounting device and a component mounting method which can prevent the occurrence of tact loss with a pickup miss.

Means for Solving the Problems

As one aspect of the invention, a component mounting device that comprises a board positioning part that positions a board, a component supply part that includes a plurality of feeders which supply components to component supply positions, an mounting head that picks up and mounts the components supplied by the feeders on the board which is positioned by the board positioning part, and a control unit that mounts the components on the board by controlling operations of the mounting head based on a mounting program in which a procedure of mounting turns that are the operations of the mounting head from picking up the component to mounting the component on the board, and identifiers of the feeders which are supply sources of the components for the mounting turns are recorded, and further comprises a component detecting unit that is provided in each of the feeders, and detects whether the component is supplied to the component supply position of the feeder, wherein the control unit, after a mounting turn that is going to be performed from now on and the identifiers of the feeders that are the supply sources of the components for the mounting turn are read out from the mounting program, determines whether there is a feeder which does not supply the component to the component supply position in the feeders corresponding to the identifiers that are read out, based on the output from the component detecting unit provided in the feeders corresponding to the identifiers that are read out, and the control unit, when there is not a feeder which does not supply the component to the component supply position in the feeders corresponding to the identifiers that are read out, performs the mounting turn that is read out, and when there is a feeder which does not supply the component to the component supply position in the feeders corresponding to the identifiers that are read out, suspends the performing of the mounting turn that is read out, and reads out another mounting turn.

In the component mounting device, the plurality of feeders have a structure that leads a plurality of the components which are not connected with each other to the component supply position.

As one aspect of the invention, a component mounting method that is performed by a component mounting device that comprises a board positioning part that positions a board, a component supply part that includes a plurality of feeders which supply components to component supply positions, an mounting head that picks up and mounts the components supplied by the feeders on the board which is positioned by the board positioning part, and a component detecting unit that is provided in each of the feeders and detects whether the component is supplied to the component supply position of the feeder, and mounts the components on the board by controlling operations of the mounting head based on a mounting program in which a procedure of mounting turns that are the operations of the mounting head from picking up the component to mounting the component on the board, and identifiers of the feeders which are supply sources of the components for the mounting turns are recorded, comprising a step of reading out a mounting turn that is going to be performed from now on and the identifiers of the feeders that are the supply sources of the components for the mounting turn from the mounting program, a step of determining, when the step of reading out a mounting turn is performed, whether there is a feeder which does not supply the component to the component supply position in the feeders corresponding to the identifiers that are read out, based on the output from the component detecting unit provided in the feeders corresponding to the identifiers that are read out, a step of performing the mounting turn that is read out when there is not a feeder which does not supply the component to the component supply position in the feeders corresponding to the identifiers that are read out as a result of the above determining, and a step of suspending the performing of the mounting turn that is read out, and reading out another mounting turn when there is a feeder which does not supply the component to the component supply position in the feeders corresponding to the identifiers that are read out as a result of the above determining.

In the component mounting method, the plurality of feeders have a structure that leads a plurality of the components which are provided to be not connected with each other to the component supply position.

Effects of the Invention

According to the present invention, when a mounting turn that is going to be performed from now on and the identifiers (the feeder numbers) of the feeders that are the supply sources of the components for the mounting turn are read out from a mounting program, it is determined whether there is a feeder which does not supply a component to the component supply position in the feeders corresponding to the identifiers that are read out, and as a result, when there is not a feeder which does not supply a component to the component supply position in the feeders corresponding to the identifiers that are read out, the mounting turn that is read out is performed, but when there is a feeder which does not supply a component to the component supply position in the feeders corresponding to the identifiers that are read out, the performing of the mounting turn that is read out is suspended, and another mounting turn is read out. Therefore, even if a component is not supplied to the component supply position of the feeder that is the supply source of the component for the mounting turn that is read out, a pickup miss will not occur. The productivity of the board can be prevented from decreasing by preventing the occurrence of tact loss.

BRIEF DESCRIPTION OF THE FIGURES

FIG. 5 is a figure which shows a part of contents of a mounting program that the component mounting device in the embodiment of the present invention uses.

FIG. 6 is a flow chart which shows a flow of component mounting operations that the component mounting device in the embodiment of the present invention performs.

EMBODIMENTS OF THE INVENTION

Below, an embodiment of the invention will be described with reference to the figures. A component mounting device 1 shown in FIG. 1 repeatedly performs a series of actions which include importing and positioning a board 2, mounting a component 4 (referring to FIG. 2) to electrodes 3 on the positioned board 2 and exporting the board 2 on which the component 4 is mounted. In the present embodiment, the direction of conveying the board 2 (arrow A show in FIG. 1) in the component mounting device 1 is assumed as an X axis direction, the direction in the horizontal plane perpendicular to the X axis direction is assumed as a Y axis direction, and the up and down direction is assumed as a Z axis direction.

Figure 1:
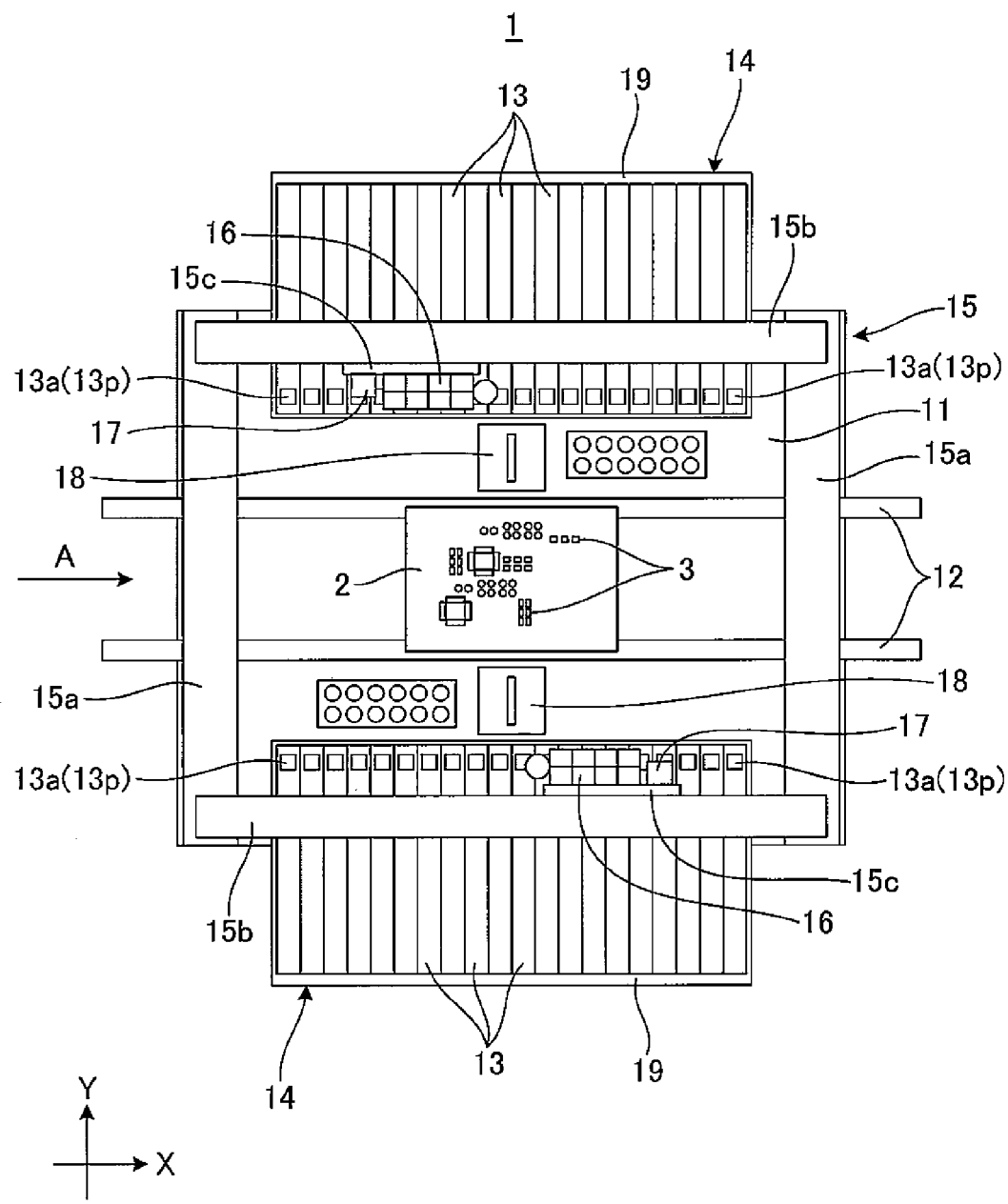
FIG. 1 is a plan view of a component mounting device in one embodiment of the present invention.

In FIG. 1, the component mounting device 1 includes a conveyor 12, a component supply part 14, and a head moving robot 15, two mounting heads 16, board cameras 17 and two component cameras 18. The conveyor 12 is provided to extend in the X axis direction on the base 11. The component supply part 14 includes a plurality of feeders 13 which supply components 4. The head moving robot 15 is provided on the base 11. The two mounting heads 16 are moved by the head moving robot 15. Each of the board cameras 17 is provided in each of the mounting heads 16. The two component cameras 18 are provided on the base 11.

The conveyor 12 includes a pair of belt conveyors. The conveyor 12 conveys the board 2 in the X axis direction with two ends of the board 2 in the Y axis direction supported from below, and positions the board 2 to a predetermined operation position. That is, in this embodiment, the conveyor 12 functions as a board positioning part for positioning the board 2.

In FIG. 1, the head moving robot 15 includes a pair of Y axis tables 15a which are provided to extend in the axis direction above the conveyor 12, two X axis tables 15b which extend in the X axis direction and are provided on the pair of Y axis tables 15a to be movable in the Y axis direction, and two moving stages 15c which are respectively provided on the two X axis table 15b to be movable in the X axis direction. The mounting heads 16 are attached to the moving stages 15c, respectively.

Figure 2:
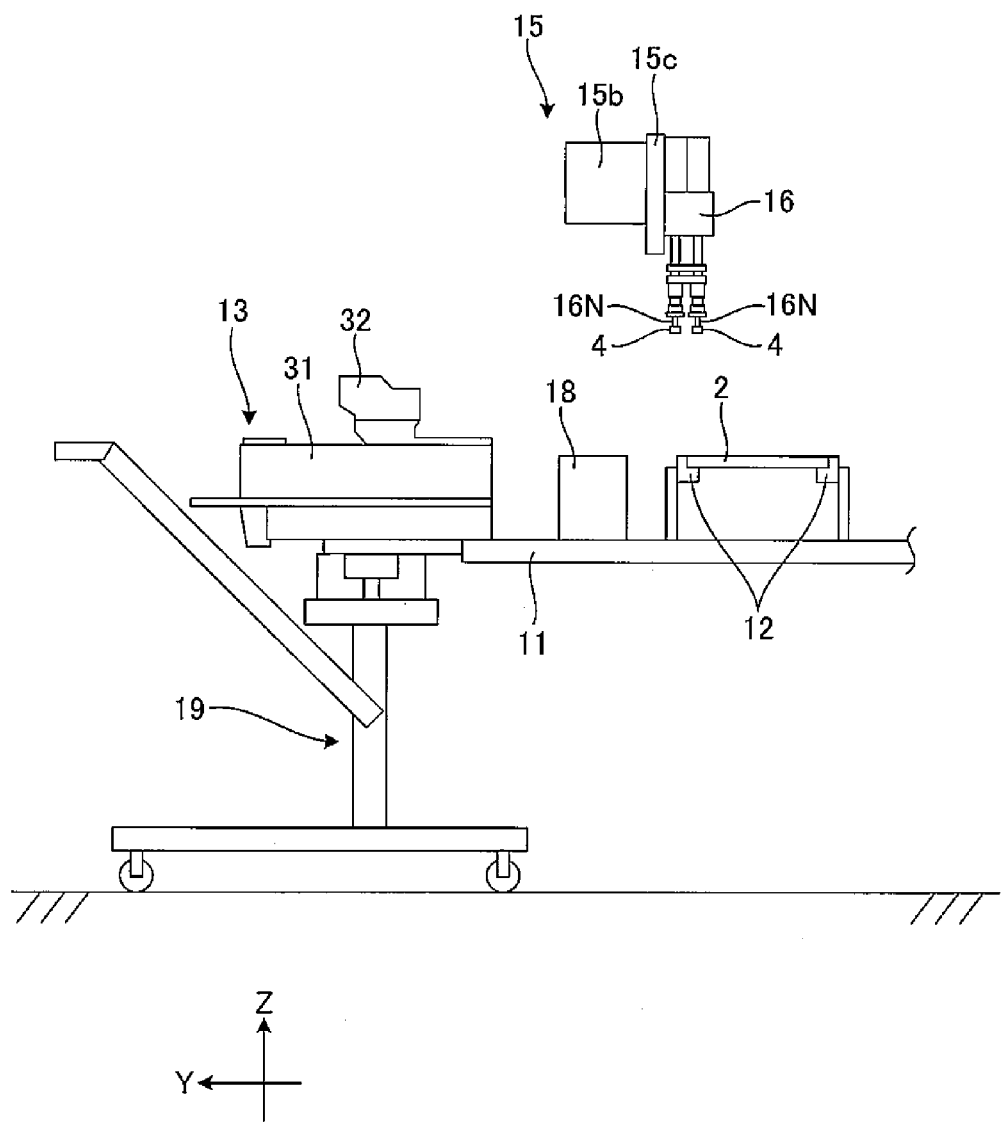
FIG. 2 is a partial side view of the component mounting device in the embodiment of the present invention.

In FIG. 2, a plurality of (here, two) adsorbing nozzles 16N are provided in each of the mounting heads 16, and each of the adsorbing nozzles 16N is movable up and down and rotatable around a up and down axis (the Z axis).

Each of the mounting heads 16 moves relative to the board 2 which is positioned by the conveyor 12, adsorbs (picks up) a component 4 which is supplied from the feeder 13 and mounts the component to the board 2 which is positioned by the conveyor 12.

Two board cameras 17 are attached to the two mounting heads 16, respectively, and are directed downward to an imaging field of vision, respectively. Further, two component cameras 18 are provided at positions to hold the conveyor 12 on the base 11, and are directed upward to an imaging field of vision, respectively.

Figure 3:
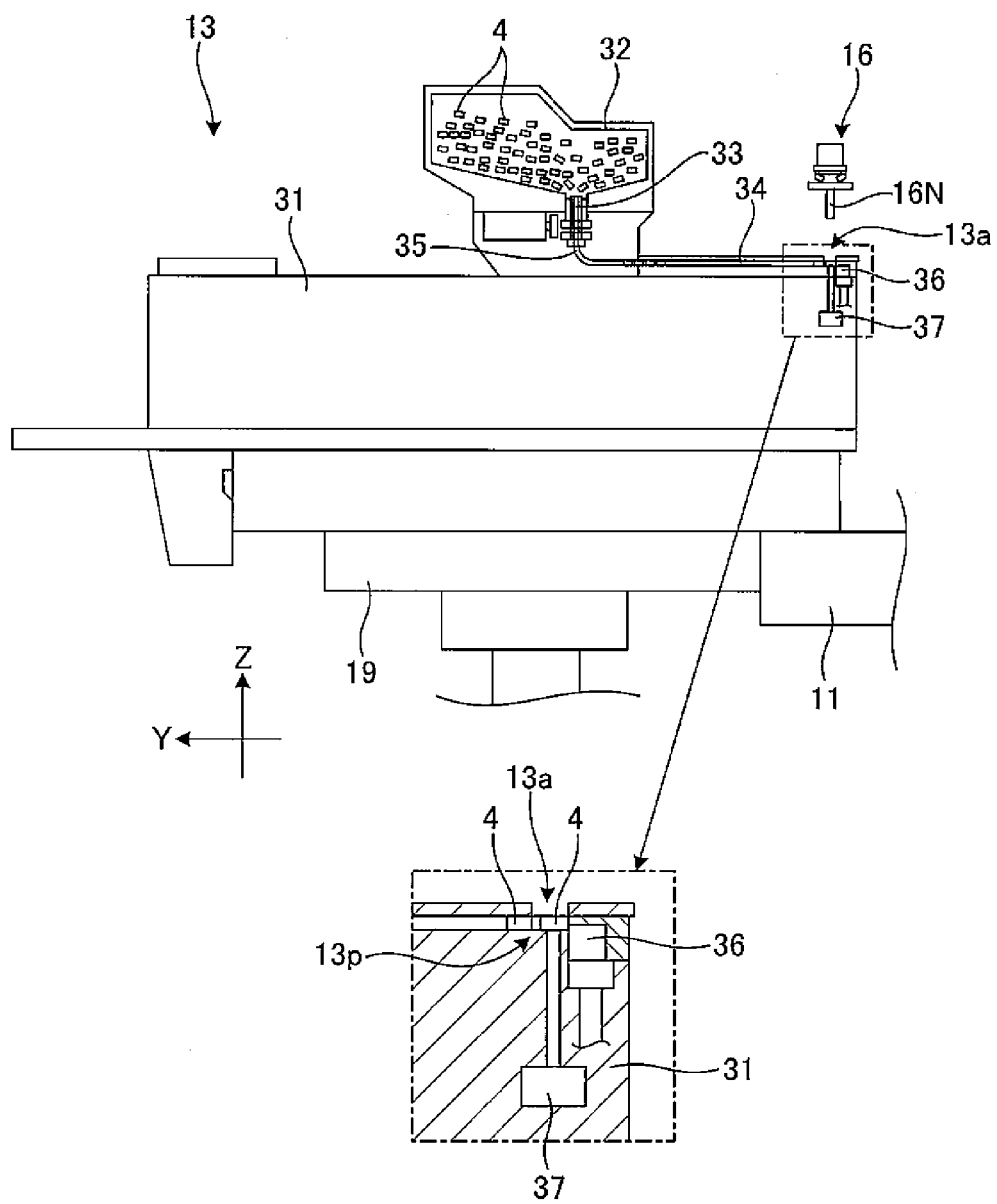
FIG. 3 is an enlarged side view of a feeder which the component mounting device in the embodiment of the present invention includes.

As shown in FIGS. 2 and 3, the plurality of feeders 13 are provided on a carriage 19 which is attached to the ends of the base 11 in the Y axis direction. The feeders 13 continually supply components 4 to component supply positions 13p at the bottoms of component supply ports 13a which are provided at the end of the central part of the base 11.

In the embodiment, the feeders 13 are bulk feeders of a structure that leads the components 4 supplied in an individual state to the component supply position 13p by giving vibration to the components 4 and absorbing the components 4, unlike tape feeders which make the taping. As shown in FIGS. 2 and 3, each of the feeders 13 includes a base part 31 which is removably attached to the carriage 19, and a component housing part 32 which is provided on the base part 31 and houses components 4 in an individual state. A component fall passage 33 that extends downward is formed inside the component housing part 32. The component fall passage 33 is connected at a connecting part 35 with a horizontal passage 34 that extends in a horizontal direction (Y axis direction) above the base part 31, and is connected to the component supply position 13p. Here, the components 4 in an individual state means that a plurality of components 4 are not connected with each other directly or indirectly, and the components 4 are dispersed in the component housing part 32.

In FIG. 3, a vacuum pressure supply part 36 which draws the component 4 which falls in the component fall passage 33 from the component housing part 32 and reaches the horizontal passage 34 to the component supply position 13p by supplying a vacuum pressure to the component supply position 13*p* is provided in the base part 31.

Figure 4:
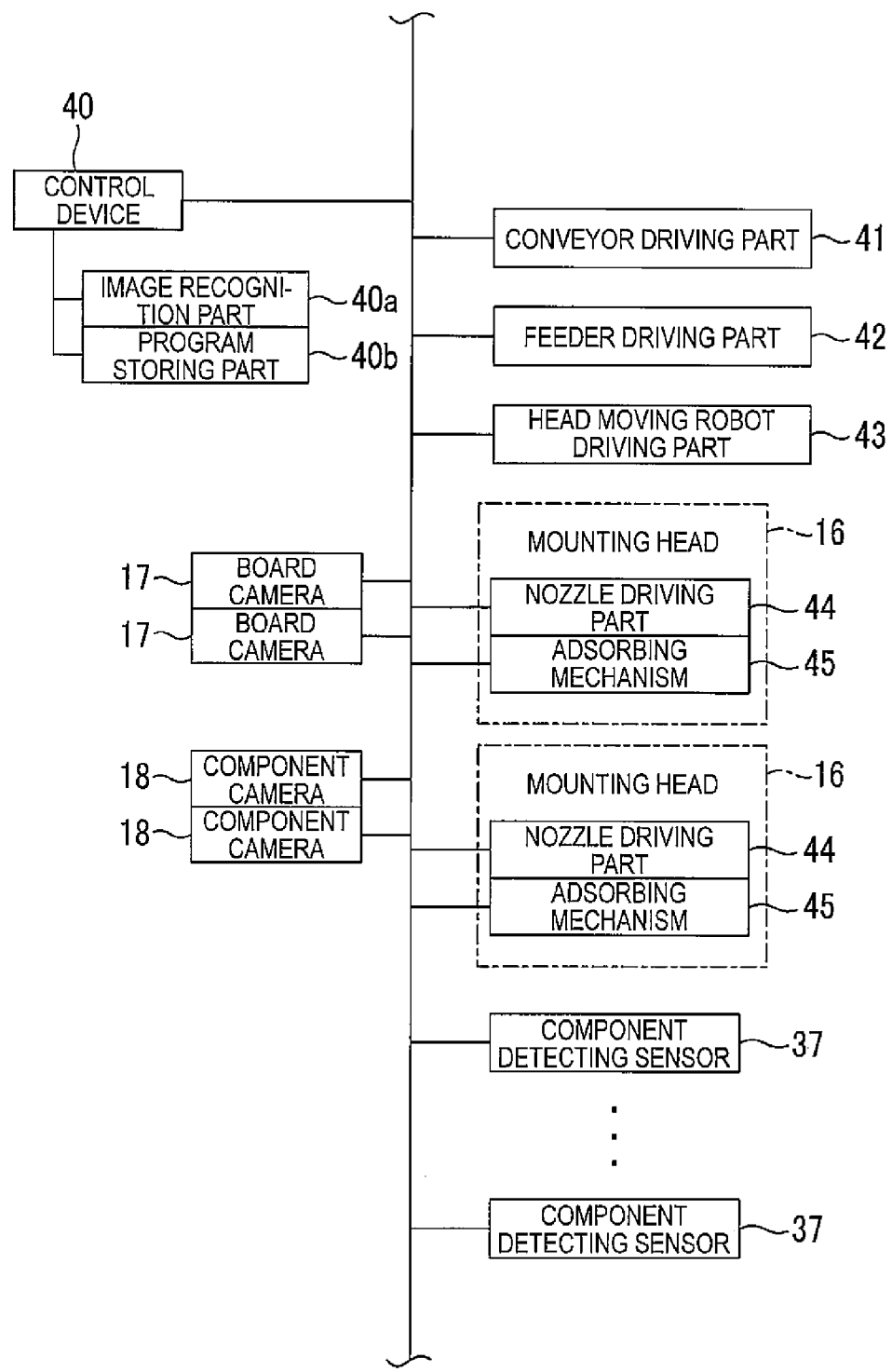
FIG. 4 is a block diagram which shows a control system of the component mounting device in the embodiment of the present invention.

In FIG. 3, a component detecting sensor 37, which detects whether or not a component 4 is supplied to the component supply position 13*p*, is provided below the component supply position 13*p* in the base part 31. In other words, the component detecting sensor 37 detects whether or not a component 4 arrives at the component supply position 13*p* due to the vacuum pressure which is supplied from the vacuum pressure supply part 36. Each of the component detecting sensors 37 includes a light projecting part which projects an inspection light upwards, and a light receiving part which receives the inspection light that arrived from above. When the component detecting sensor 37 detects that the inspection light that is projected upwards from the light projecting part is reflected at the bottom surface of the component 4 located at the component supply position 13*p* and arrives at the light receiving part (in other words, when the component 4 is supplied to the component supply position 13*p*), a component detecting signal is output to the control device 40 (FIG. 4).

A control device 40 (FIG. 4), which the component mounting device 1 includes, controls operations of a conveyor driving part 41 (FIG. 4) which includes an actuator such as a motor which is not shown in the figure so that the board 2 is conveyed and positioned to the predetermined operation position (the position shown in FIG. 1) by the conveyor 12. The control device 40 controls operations of a feeder driving part 42 (FIG. 4) which includes an actuator which is not shown in the figure so that the component 4 is supplied to the component supply position 13*p* by the feeder 13.

For the feeders 13, when the carriage 19 is attached to the end part of the base 11, a connector (not shown in the figure) of the carriage 19 is fitted to and connected with a connector (not shown in the figure) of the base 11 so that it becomes possible for the control device 40 to control operations of the feeders 13. Feeder numbers (1, 2, 3 . . . ) as identifiers in control data are given to the feeders 13, respectively.

The control device 40 controls operations of a head moving robot driving part 43 (FIG. 4) to make the X axis tables 15*b* to move in the Y axis direction relative to the Y axis tables 15*a* and make the moving stages 15*c* to move in the X axis direction relative to the X axis tables 15*b*, so that the mounting heads 16 move in directions of a horizontal plane.

The control device 40 controls operations of a nozzle driving part 44 (FIG. 4) which includes an actuator which is not shown in the figure so that the adsorbing nozzles 16N, which the mounting heads 16 include, move up and down and rotate around the up and down axis relative to the mounting heads 16.

The control device 40 controls operations of an adsorbing mechanism 45 (FIG. 4) which includes an actuator which is not shown in the figure to supply a vacuum pressure to the absorbing nozzles 16N and release the supply of the vacuum pressure so that the components 4 are adsorbed (picked up) and unabsorbed (separated) by the adsorbing nozzles 16N of the mounting heads 16.

The control device 40 controls imaging operations of each of the board cameras 17 and imaging operations of each of the component cameras 18 (FIG. 4). Image data obtained by the imaging operations of each of the board cameras 17 and image data obtained by the imaging operations of each of the component cameras 18 are processed to be recognized in an image recognition part 40*a* (FIG. 4) of the control device 40.

In FIG. 3, a component detecting sensor 37, which detects whether or not a component 4 is supplied to the component supply position 13*p*, is provided below the component supply position 13*p* in the base part 31. In other words, the component detecting sensor 37 detects whether or not a component 4 arrives at the component supply position 13*p* due to the vacuum pressure which is supplied from the vacuum pressure supply part 36. Each of the component detecting sensors 37 includes a light projecting part which projects an inspection light upwards, and a light receiving part which receives the inspection light that arrived from above. When the component detecting sensor 37 detects that the inspection light that is projected upwards from the light projecting part is reflected at the bottom surface of the component 4 located at the component supply position 13*p* and arrives at the light receiving part (in other words, when the component 4 is supplied to the component supply position 13*p*), a component detecting signal is output to the control device 40 (FIG. 4).

As shown in FIG. 5, the procedure of mounting turns that are the operations of the mounting head 16 from picking up a component 4 to mounting the component 4 on the board 2, and the feeder numbers as the identifiers of the feeders 13 which are the supply sources of the components for the mounting turns are recorded in the mounting program. In FIG. 5, two feeder numbers are recorded for one mounting turn because one mounting head 16 includes two adsorbing nozzles 16N and in one mounting turn, the components 4 are adsorbed and mounted on the board 2 by the two adsorbing nozzles 16N respectively.

The control device 40 sequentially reads out a mounting turn recorded in the mounting program from the head of the mounting program. When the mounting turn is read out, the control device 40 also reads out the feeder numbers of one or a plurality of feeders 13 that are the supply sources of the components 4 for the mounting turn. The control device 40 makes the mounting head 16 operate so that the components 4 from the one or a plurality of feeders 13 corresponding to the feeder numbers are picked up and mounted to the board 2 which is positioned by the conveyor 12.

In the present embodiment, each of the mounting heads 16 is an mounting head that picks up a component 4 which is supplied from the feeder 13 and mounts the component 4 to the board 2 which is positioned by the conveyor 12. The control device 40 is a device that makes the component 4 to be mounted on the board 2 by controlling operations of the mounting head 16 based on the mounting program in which the procedure of mounting turns that are the operations of the mounting head 16 from picking up the component 4 to mounting the component 4 on the board 2, and the feeder numbers of the feeders 13 which are the supply sources of the component for the mounting turns are recorded.

From the mounting program, the control device 40 reads out a mounting turn that is going to be performed from now on, and reads out the feeder numbers of the feeders 13 that are the supply sources of the components 4 for the mounting turn. The control device 40 determines whether there is a feeder 13 which does not supply a component 4 to the component supply position 13*p* (hereinafter referred to as a non-supply feeder) in the one or a plurality of feeders 13 corresponding to the feeder numbers that are read out, based on the output from the component detecting sensors 37 (whether or not component detecting signals are output) provided in the one or a plurality of feeders 13 corresponding to the feeder numbers that are read out. In particular, when there is one component detecting signal that is not output from the component detecting sensors 37 which are included in the one or a plurality of feeders 13 corresponding to the feeder numbers that are read out, the control device 40 determines that there is a non-supply feeder in the one or a plurality of feeders 13 corresponding to the feeder numbers that are read out. As a result of the above determination, when there is not a non-supply feeder in the one or a plurality of feeders 13 corresponding to the feeder numbers that are read out, the control device 40 performs the mounting turn that is read out. Further, as a result of the above determination, when there is one non-supply feeder in the one or a plurality of feeders 13 corresponding to the feeder numbers that are read out, the control device 40 suspends the performing of the mounting turn, and then reads out another mounting turn.

For example, for the mounting turn of number 3 shown in FIG. 5, when a component detecting signal is not output from the component detecting sensor 37 which at least one feeder 13 among the two feeders 13 (feeder 13 of the feeder number "5" and feeder 13 of the feeder number "6") which are the supply sources of the components 4 for the mounting turn includes, the control device 40 suspends the performing of the mounting turn of number 3, reads out a mounting turn of number 4 as another mounting turn and performs earlier the mounting turn of number 4. After the mounting turn of number 4 has been performed, the suspended mounting turn of number 3 is read out again and performed.

Further, when there is a non-supply feeder in the feeders 13 corresponding to the another mounting turn that is read out after the suspension, the performing of the another mounting turn is also suspended. After that, another mounting turn (in this case, the another mounting turn can include the originally suspended mounting turn) is read out again.

Then, a performing procedure of component mounting operations of the component mounting device 1 to mount the components 4 to the board 2 is described using a flow chart of FIG. 6.

In the component mounting operations, the control device 40 makes the board 2, which has been cast from other devices (for example, a solder printing machine) placed in the upstream of the component mounting device 1, to be imported and positioned at a predetermined operation position by the conveyor 12 (step ST1 shown in FIG. 6). After the board 2 is positioned, the control device 40 makes the board camera 17 (the mounting head 16) move to be over the board 2 by making the head moving robot 15 to operate. The control device 40 makes the board camera 17 image a board mark (not shown in the figure) which is provided on the board 2, and performs the image recognition of the board mark in the image recognition part 40a.

The control device 40 calculates a position deviation (position deviation from the normal operation position of the board 2) of the board 2 (step ST2 shown in FIG. 6).

After the control device 40 calculates the position deviation of the board 2, the control device 40 reads out a mounting turn that is going to be performed from now on from the mounting program (step ST3 shown in FIG. 6). Then, the control device 40 reads out feeder numbers of one or a plurality of feeders 13 that are the supply sources of the components 4 for the mounting turn that is read out (step ST4 shown in FIG. 6). The control device 40 determines whether there is a feeder 13 (non-supply feeder) which does not supply a component 4 to the component supply position 13p in the one or a plurality of feeders 13 corresponding to the feeder numbers that are read out, based on whether component detecting signals are output from all component detecting sensors 37 which the one or a plurality of feeders 13 corresponding to the feeder numbers that are read out include (step ST5 shown in FIG. 6).

When there is a non-supply feeder in the one or a plurality of feeders 13 corresponding to the feeder numbers that are read out as a result of the above determination, the control device 40 suspends the performing of the mounting turn that is read out, and reads out another mounting turn (step ST6 shown in FIG. 6). Then, the procedure returns to the step ST4, and the control device 40 reads out feeder numbers of the feeders 13 that are the supply sources of the components 4 in the another mounting turn that is read out in the step ST6.

On the other hand, when there is not a non-supply feeder in the one or a plurality of feeders 13 corresponding to the feeder numbers that are read out in the step ST5, the control device 40 picks up the components 4 supplied from the feeders 13 corresponding to the mounting turn that is read out in the step ST3 (step ST7 shown in FIG. 6). In particular, the control device 40 makes the mounting head 16 move to be above the feeder 13 which is the supply source of the component 4 for the mounting turn that is read out in the step ST3, makes the adsorbing nozzle 16N contact the component 4 supplied to the component supply position 13p of the feeder 13, and controls the operation of the adsorbing mechanism 45. Therefore, the control device 40 supplies the vacuum pressure to the adsorbing nozzle 16N and the component 4 is adsorbed by the adsorbing nozzle 16N.

After the component 4 is picked up by the mounting head 16, the control device 40 makes the mounting head 16 move so that the component 4 which is picked up passes over the component camera 18, and makes the component camera 18 image the component 4 from below. After the component camera 18 images the component 4, the control device 40 performs the image recognition of an obtained image in the image recognition part 40a (step ST8 shown in FIG. 6).

After the image recognition of the component 4 is performed in the image recognition part 40a, the control device 40 detects abnormality (deformation or defect) of the component 4 based on an obtained image recognition result. When the abnormality (deformation or defect) of the component 4 is detected, the control device 40 calculates the adsorbing deviation of the component 4 relative to the adsorbing nozzle 16N (step ST9 shown in FIG. 6).

After the abnormality of the component 4 is detected and the adsorbing deviation of the component 4 is calculated, the control device 40 mounts the component 4 which is picked up on the board 2 (step ST10 shown in FIG. 6). In particular, the mounting of the component 4 on the board 2 is performed as follows. The control device 40 makes the mounting head 16 move to be above the board 2, then makes the component 4 which is adsorbed by the adsorbing nozzle 16N contact a target mounting site (solder is printed on the electrode 3 at the target mounting site by a solder printing machine placed in the upstream of the component mounting device 1) on the board 2 by controlling the operation of the nozzle driving part 44, and releases the supply of the vacuum pressure to the adsorbing nozzle 16N by controlling the operation of the adsorbing mechanism 45.

When the component 4 is mounted on the board 2, the control device 40 performs position revision (including rotary revision) of the adsorbing nozzle 16N relative to the board 2 to cancel the position deviation of the board 2 calculated in the step ST2 and the adsorbing deviation of the component 4 calculated in the step ST9.

After the component 4 which is picked up is mounted on the board 2, the control device 40 determines whether or not all components 4 that should be mounted on the board 2 have been mounted (step ST11 shown in FIG. 6). When all components 4 that should be mounted on the board 2 has not been mounted on the board 2, the procedure returns to the step ST3, and the control device 40 reads out a mounting turn. When all components 4 that should be mounted on the board 2 have been mounted on the board 2, the control device 40 exports the board 2 to another device (for example, a post-mounting inspection machine) which is placed in the downstream of the component mounting device 1 by making the conveyor 12 operate (step ST12 shown in FIG. 6).

The component mounting device 1 in the present embodiment includes the component detecting sensor 37 as a component detecting unit that is provided in each of the feeders 13, and detects whether a component 4 is supplied to the component supply position 13p of the feeder 13. The control device 40 reads out a mounting turn that is going to be performed from now on and the feeder numbers of the feeders 13 that are the supply sources of the components 4 for the mounting turn from the mounting program. Then, the control device 40 determines whether there is a feeder 13 which does not supply a component 4 to the component supply position 13p in the feeders 13 corresponding to the feeder numbers that are read out, based on the output from the component detecting sensors 37 provided in the feeders 13 corresponding to the feeder numbers that are read out. As a result of the determination, when there is not a feeder 13 which does not supply a component 4 to the component supply position 13p in the feeders 13 corresponding to the feeder numbers that are read out, the control device 40 performs the mounting turn that is read out. As a result of the determination, when there is a feeder 13 which does not supply a component 4 to the component supply position 13p in the feeders 13 corresponding to the feeder numbers that are read out, the control device 40 suspends the performing of the mounting turn that is read out, and reads out another mounting turn.

Further, the component mounting method performed by the component mounting device 1 includes a mounting turn reading out step (step ST3) that reads out a mounting turn that is going to be performed from now on and the feeder numbers of the feeders 13 that are the supply sources of the components 4 for the mounting turn from the mounting program, a determining step (step ST5) that, after the mounting turn reading out step is performed, determines whether there is a feeder 13 which does not supply a component 4 to the component supply position 13p in the feeders 13 corresponding to the feeder numbers that are read out, based on the output from the component detecting sensors 37 provided in the feeders 13 corresponding to the feeder numbers that are read out, a mounting turn performing step (step ST8 to step ST11) that performs the mounting turn that is read out, when there is not a feeder 13 which does not supply a component 4 to the component supply position 13p in the feeders 13 corresponding to the feeder numbers that are read out as a result of the above determination, and an another mounting turn reading out step (step ST6) that suspends the performing of the mounting turn that is read out, and reads out another mounting turn when there is a feeder 13 which does not supply a component 4 to the component supply position 13p in the feeders 13 corresponding to the feeder numbers that are read out as a result of the above determination.

Therefore, for the component mounting device 1 and the component mounting method in the present embodiment, even if a component 4 is not supplied to the component supply position 13p of the feeder 13 that is the supply source of the component 4 for the mounting turn that is read out, a pickup miss will not occur. The productivity of the board 2 can be prevented from decreasing by preventing the occurrence of tact loss.

The embodiment of the present invention is described as above, but the present invention is not limited to the above. For example, in the above embodiment, one mounting head 16 has a structure that includes two adsorbing nozzles 16N, but the number of the adsorbing nozzles 16N which the mounting head 16 includes is not particularly limited. Further, in the above embodiment, a bulk feeder is shown as the feeder 13, but the type of the feeders 13 is not particularly limited. The feeders 13 may have a structure that leads components 4 supplied in an individual state to the component supply position 13p, which includes stick feeders and bowl feeders besides the bulk feeders shown in the above embodiment. When the feeders 13 have a structure that leads the components 4 supplied in an individual state to the component supply position 13p, because it is likely that the component 4 is not supplied to the component supply position 13p at the time of reading out a mounting turn, the above effect is greater than that when the feeders 13 are tape feeders for which the components 4 which are aligned through the taping are more likely to be precisely supplied to the component supply position 13p at the time of reading out a mounting turn.

Although the present invention is described in detail with reference to specific embodiments, it is apparent that various modifications and amendments may be made by those skilled in the art without departing from the spirit and scope of the invention.

This application is based on the Japanese patent application (patent application 2011-23617) filed on Feb. 7, 2011, whose content is incorporated herein by reference.

Industrial Applicability

The component mounting device and the component mounting method, which can prevent the occurrence of tact loss with a pickup miss, are provided.

Description Of The Symbols 1 component mounting device
2 board
3 electrode
4 component
11 base
12 conveyor (board positioning part)
13 feeder
13a component supply port
13p component supply position
14 component supply part
15 head moving robot
15a Y axis table
15b X axis table
15c moving stage
16 mounting head
16N adsorbing nozzle
17 board camera
18 component camera
19 carriage
31 base part
32 component housing part
33 component fall passage
34 horizontal passage
35 connecting part
36 vacuum pressure supply part
37 component detecting sensor (component detecting unit)
40 control device (control unit)
40a image recognition part
40b program storing part
41 conveyor driving part
42 feeder driving part
43 head moving robot driving part
44 nozzle driving part
45 adsorbing mechanism

The invention claimed is:

1. A component mounting device comprising:
a board positioning part that positions a board;
a component supply part that includes a plurality of feeders which supply components to component supply positions;
a mounting head that picks up and mounts the components supplied by the feeders on the board which is positioned by the board positioning part;
a control unit that mounts the components on the board by controlling an operation of the mounting head based on a mounting program in which a procedure of mounting turns that are the operation of the mounting head from picking up the component to mounting the component on the board, and identifiers of the feeders which are supply sources of the components for the mounting turns are recorded;
a component detecting unit that is provided below the component supply position in each of the feeders, and detects whether the component is supplied to the component supply position of the feeder; and
a component camera which is provided between the board positioning part and the component supply part and which images the component which is being picked up by the mounting head,
wherein the control unit, after a mounting turn that is going to be performed from now on and the identifiers of the feeders that are the supply sources of the components for the mounting turn are read out from the mounting program, determines before picking up the component whether there is a feeder which does not supply the component to the component supply position in the feeders corresponding to the identifiers that are read out, based on an output from the component detecting unit provided in the feeders corresponding to the identifiers that are read out, and
the control unit, when there is not a feeder which does not supply the component to the component supply position in the feeders corresponding to the identifiers that are read out, performs the mounting turn that is read out, and when there is a feeder which does not supply the component to the component supply position in the feeders corresponding to the identifiers that are read out, suspends performing of the mounting turn that is read out on the board, and reads out and performs another mounting turn on the board to which the suspended mounting turn is to be performed, and
wherein the plurality of feeders have a structure that leads a plurality of the components which are not connected with each other to the component supply position.

2. The component mounting device according to claim 1, wherein the control unit reads out the suspended mounting turn after another mounting turn is performed.

3. The component mounting device according to claim 1, wherein the component detecting unit detects whether or not the component arrives at the component supply position due to a vacuum pressure which is supplied from a vacuum pressure supply.

4. A component mounting method that is performed by a component mounting device that comprises a board positioning part that positions a board, a component supply part that includes a plurality of feeders which supply components to component supply positions, a mounting head that picks up and mounts the components supplied by the feeders on the board which is positioned by the board positioning part, a component detecting unit that is provided below the component supply position in each of the feeders and detects whether the component is supplied to the component supply position of the feeder, and mounts the components on the board by controlling an operation of the mounting head based on a mounting program in which a procedure of mounting turns that are the operation of the mounting head from picking up the component to mounting the component on the board, and identifiers of the feeders which are supply sources of the components for the mounting turns are recorded, and a component camera which is provided between the board positioning part and the component supply part and which images the component which is being picked up by the mounting head, wherein the plurality of feeders have a structure that leads a plurality of the components which are provided to be not connected with each other to the component supply position, comprising the steps of:
reading out a mounting turn that is going to be performed from now on and the identifiers of the feeders that are the supply sources of the components for the mounting turn from the mounting program,
determining, when the step of reading out the mounting turn is performed, before picking up the component, whether there is a feeder which does not supply the component to the component supply position in the feeders corresponding to the identifiers that are read out, based on the output from the component detecting unit provided in the feeders corresponding to the identifiers that are read out,
performing the mounting turn that is read out when there is not a feeder which does not supply the component to the component supply position in the feeders corresponding to the identifiers that are read out as a result of the determining, and
suspending the performing of the mounting turn that is read out on the board, and reading out and performing another mounting turn on the board to which the suspended mounting turn is to be performed when there is a feeder which does not supply the component to the component supply position in the feeders corresponding to the identifiers that are read out as a result of the determining.

5. The component mounting method according to claim 4, wherein the control unit reads out the suspended mounting turn after another mounting turn is performed.

6. The component mounting method according to claim 4, wherein the component detecting unit detects whether or not the component arrives at the component supply position due to a vacuum pressure which is supplied from a vacuum pressure supply.

* * * * *